(12) United States Patent
Chu et al.

(10) Patent No.: US 11,322,438 B2
(45) Date of Patent: May 3, 2022

(54) PACKAGE STRUCTURE AND MANUFACTURING METHOD THEREOF

(71) Applicant: Winbond Electronics Corp., Taichung (TW)

(72) Inventors: Yen-Jui Chu, Taichung (TW); Hsin-Hung Chou, Taichung (TW); Chun-Hung Lin, Taichung (TW)

(73) Assignee: Winbond Electronics Corp., Taichung (TW)

( * ) Notice: Subject to any disclaimer, the term of this patent is extended or adjusted under 35 U.S.C. 154(b) by 4 days.

(21) Appl. No.: 17/015,012

(22) Filed: Sep. 8, 2020

(65) Prior Publication Data

US 2022/0077051 A1   Mar. 10, 2022

(51) Int. Cl.
| | | |
|---|---|---|
| *H01L 23/498* | (2006.01) | |
| *H01L 23/00* | (2006.01) | |
| *H01L 23/13* | (2006.01) | |
| *H01L 21/56* | (2006.01) | |
| *H01L 23/31* | (2006.01) | |

(52) U.S. Cl.
CPC ........ *H01L 23/49861* (2013.01); *H01L 23/13* (2013.01); *H01L 24/24* (2013.01); *H01L 24/32* (2013.01); *H01L 24/73* (2013.01); *H01L 24/82* (2013.01); *H01L 24/83* (2013.01); *H01L 24/92* (2013.01); *H01L 21/56* (2013.01); *H01L 23/3121* (2013.01); *H01L 2224/24175* (2013.01); *H01L 2224/32237* (2013.01); *H01L 2224/73267* (2013.01); *H01L 2224/82101* (2013.01); *H01L 2224/83192* (2013.01); *H01L 2224/92244* (2013.01); *H01L 2924/15153* (2013.01)

(58) Field of Classification Search
CPC ........... H01L 23/49861; H01L 23/3121; H01L 23/13; H01L 21/56; H01L 24/24; H01L 24/92; H01L 24/32; H01L 24/82; H01L 2224/83; H01L 24/13; H01L 24/73; H01L 24/83; H01L 23/4986
See application file for complete search history.

(56) References Cited

U.S. PATENT DOCUMENTS

| | | | | |
|---|---|---|---|---|
| 5,710,695 | A | * | 1/1998 | Manteghi ................ H01L 23/24 361/764 |
| 6,380,615 | B1 | * | 4/2002 | Park .................... H01L 25/0657 257/686 |
| 8,404,960 | B2 | | 3/2013 | Prather et al. |
| 9,935,028 | B2 | | 4/2018 | Spory |
| 2009/0283887 | A1 | * | 11/2009 | Takayama ........... H01L 31/0203 257/680 |

OTHER PUBLICATIONS

"Office Action of Taiwan Counterpart Application", dated Jan. 6, 2021, pp. 1-8.

* cited by examiner

*Primary Examiner* — Jasmine J Clark
(74) *Attorney, Agent, or Firm* — JCIPRNET

(57) ABSTRACT

A package structure including a lead frame structure, a die, an adhesive layer, and at least one three-dimensional (3D) printing conductive wire is provided. The lead frame structure includes a carrier and a lead frame. The carrier has a recess. The lead frame is disposed on the carrier. The die is disposed in the recess. The die includes at least one pad. The adhesive layer is disposed between a bottom surface of the die and the carrier and between a sidewall of the die and the carrier. The 3D printing conductive wire is disposed on the lead frame, the adhesive layer, and the pad, and is electrically connected between the lead frame and the pad.

20 Claims, 8 Drawing Sheets

PACKAGE STRUCTURE AND MANUFACTURING METHOD THEREOF

BACKGROUND OF THE INVENTION

1. Field of the Invention

The invention relates to a semiconductor device and a manufacturing method thereof, and particularly relates to a package structure and a manufacturing method thereof.

2. Description of Related Art

Internal bonding methods for a traditional semiconductor package may be divided into wire bonding, tape automated bonding (TAB), and flip chip bonding. The wire bonding is the most widely used bonding technology due to a mature process, low costs, and high wiring flexibility. However, the wire bonding is characterized with a disadvantage of a limit on a number of input/output (I/O) leads. In addition, in a case of miniaturization of a package size in an advanced packaging process, because the wire bonding has limitations in an arc height and distance during use, the package size cannot be miniaturized.

SUMMARY OF THE INVENTION

The invention provides a package structure and a manufacturing method thereof, which can cause a package size to be miniaturized.

The invention provides a package structure, which includes a lead frame structure, a die, an adhesive layer, and at least one three-dimensional (3D) printing conductive wire. The lead frame structure includes a carrier and a lead frame. The carrier has a recess. The lead frame is disposed on the carrier. The die is disposed in the recess. The die includes at least one pad. The adhesive layer is disposed between a bottom surface of the die and the carrier and between a sidewall of the die and the carrier. The 3D printing conductive wire is disposed on the lead frame, the adhesive layer, and the pad, and is electrically connected between the lead frame and the pad.

The invention provides a method of manufacturing a package structure, which includes the following steps: providing a lead frame structure, wherein the lead frame structure includes a carrier and a lead frame, the carrier includes a recess, and the lead frame is disposed on the carrier; filling the recess with an adhesive; placing the die in the recess to cause the adhesive to overflow from a position between a bottom surface of the die and the carrier to a position between a sidewall of the die and the carrier, thereby forming an adhesive layer, wherein the die includes at least one pad; and forming at least one 3D printing conductive wire on the lead frame, the adhesive layer, and the pad by using a 3D printing process, wherein the 3D printing conductive wire is electrically connected between the lead frame and the pad.

Based on the above description, in the package structure and the manufacturing method thereof according to the invention, the die is disposed in the recess, and the lead frame is electrically connected to the pad by using the 3D printing conductive wire. Therefore, there is no limitation on the arc height and distance of wire bonding, which further reduces a distance between the die and the lead frame and reduces the thickness of the package structure, thereby miniaturizing the package size. In addition, there is no limitation on the arc height and distance of wire bonding, thereby facilitating increase of the number of I/O leads. Furthermore, by using the package structure and the manufacturing method thereof according to the invention, processes such as a redistribution layer (RDL) process and a wire bonding process can be omitted, thereby effectively simplifying the processes.

In order to make the aforementioned and other objects, features and advantages of the invention comprehensible, several exemplary embodiments accompanied with figures are described in detail below.

BRIEF DESCRIPTION OF THE DRAWINGS

The accompanying drawings are included to provide a further understanding of the invention, and are incorporated in and constitute a part of this specification. The drawings illustrate embodiments of the invention and, together with the description, serve to explain the principles of the invention.

DESCRIPTION OF THE EMBODIMENTS

FIG. 1A to FIG. 1E are perspective views illustrating a manufacturing process of a package structure according to an embodiment of the invention. FIG. 2A to FIG. 2E are cross-sectional views taken along a section line I-I' in FIG. 1A to FIG. 1E.

Figure 1A:
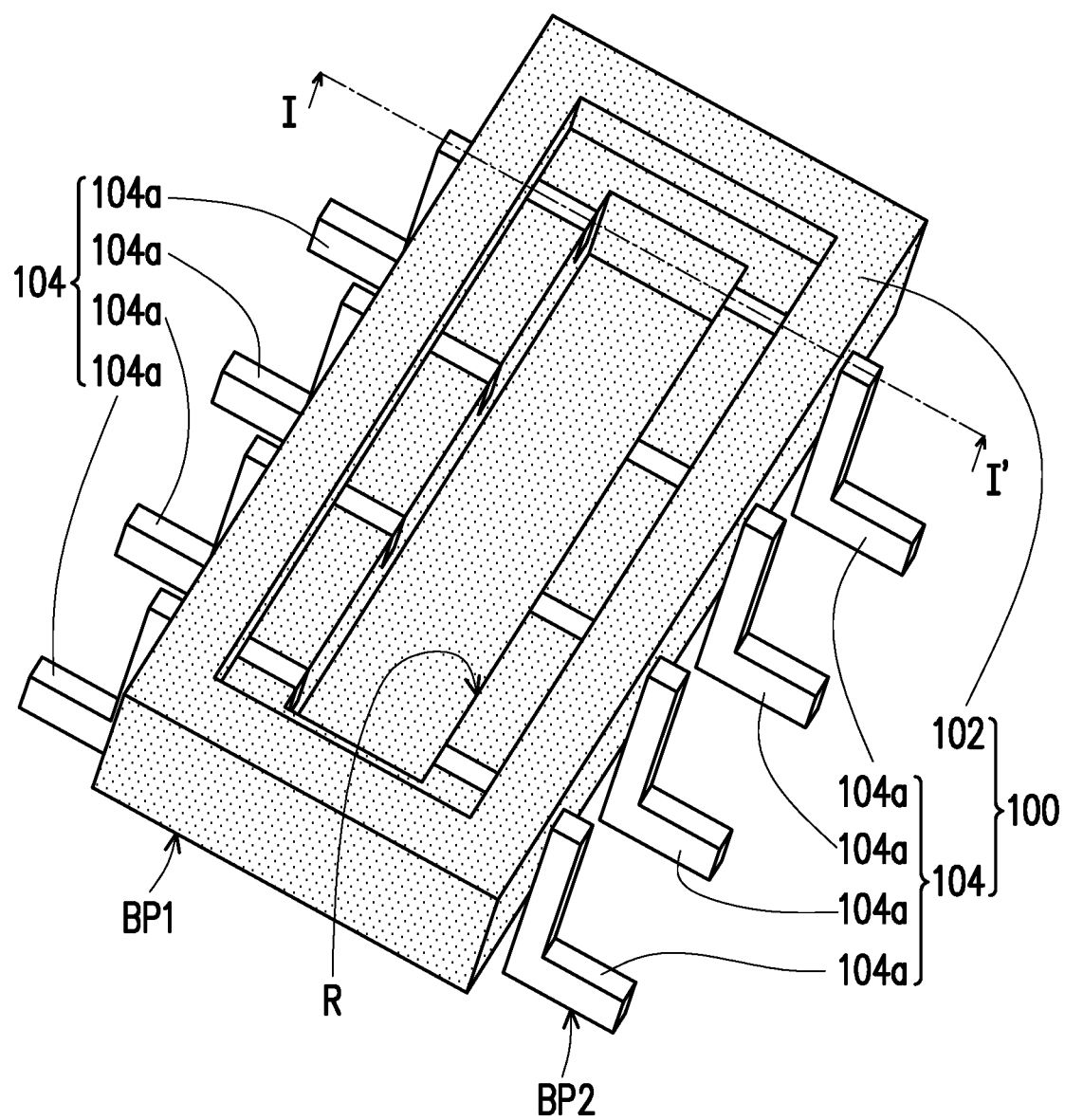
FIG. 1A to FIG. 1E are perspective views illustrating a manufacturing process of a package structure according to an embodiment of the invention.
Figure 2A:
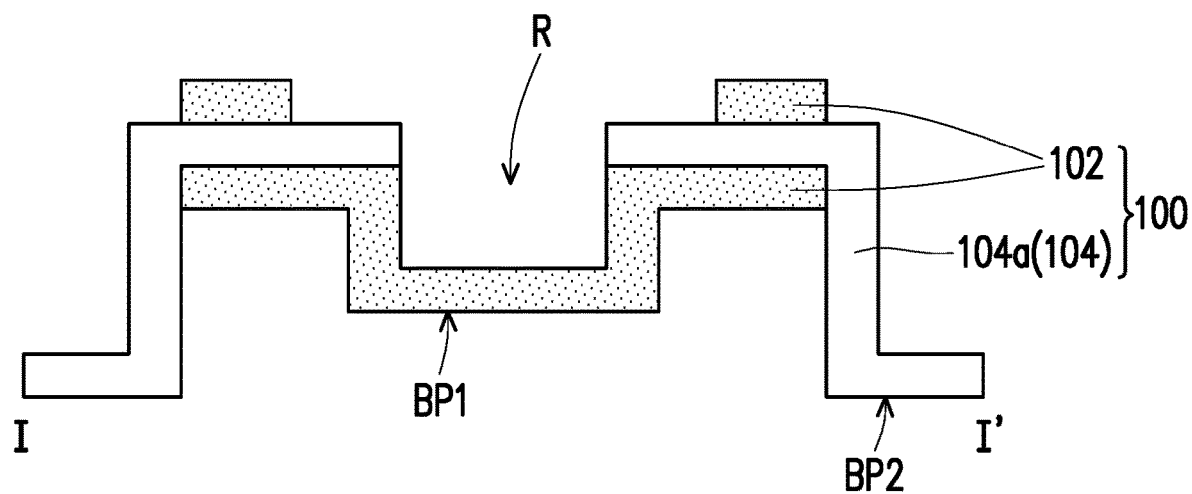
FIG. 2A to FIG. 2E are cross-sectional views taken along a section line I-I' in FIG. 1A to FIG. 1E.

Referring to FIG. 1A and FIG. 2A, a lead frame structure 100 is provided. The lead frame structure 100 includes a carrier 102 and a lead frame 104. The carrier 102 may be configured to fix and carry the lead frame 104. The carrier 102 has a recess R. The recess R may be configured to accommodate a die. The carrier 102 may cover a portion of the lead frame 104 to cause the carrier 102 to be higher than the lead frame 104. The material of the carrier 102 may include a molding compound such as an epoxy molding compound (EMC).

The lead frame 104 is disposed on the carrier 102. The bottom BP2 of the lead frame 104 may be lower than the bottom BP1 of the carrier 102. The lead frame 104 may include a plurality of leads 104a. The material of the lead frame 104 may include copper alloy or iron-nickel alloy.

Figure 1B:
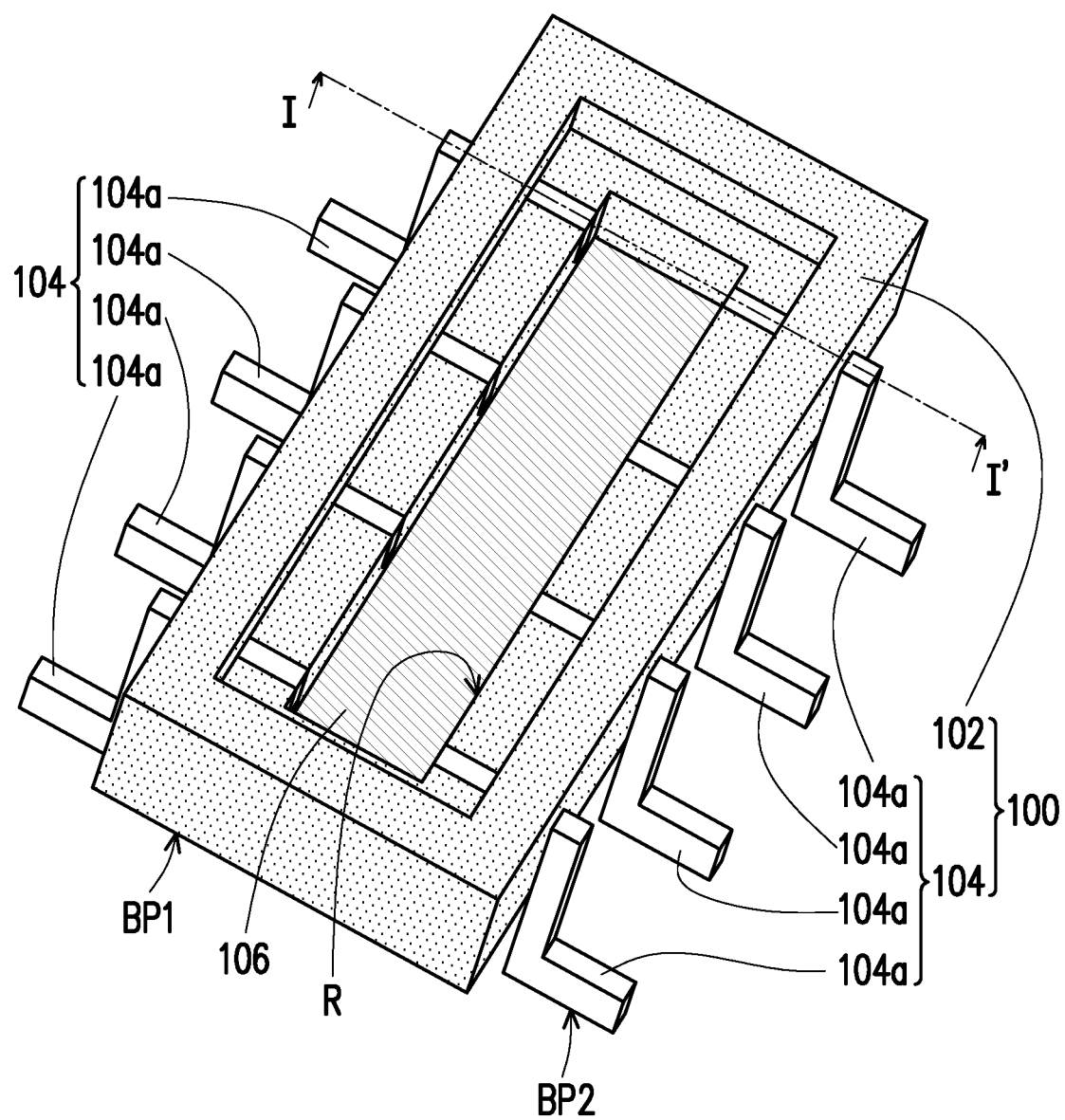
Figure 2B:
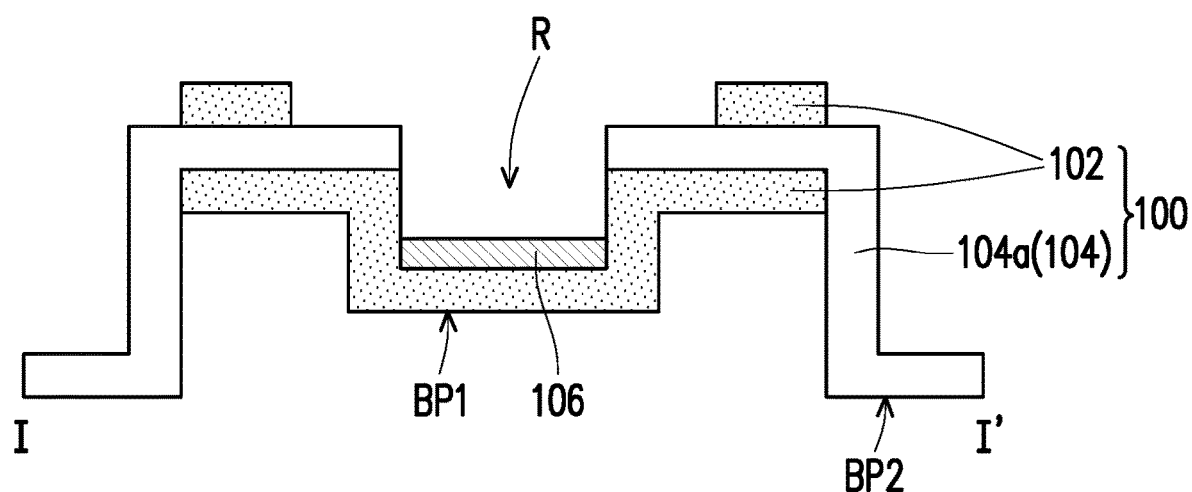

Referring to FIG. 1B and FIG. 2B, the recess R is filled with an adhesive 106. The material of the adhesive 106 includes an acrylic adhesive, a polyurethane adhesive, a silicone adhesive, or a rubber adhesive, etc.

Figure 1C:
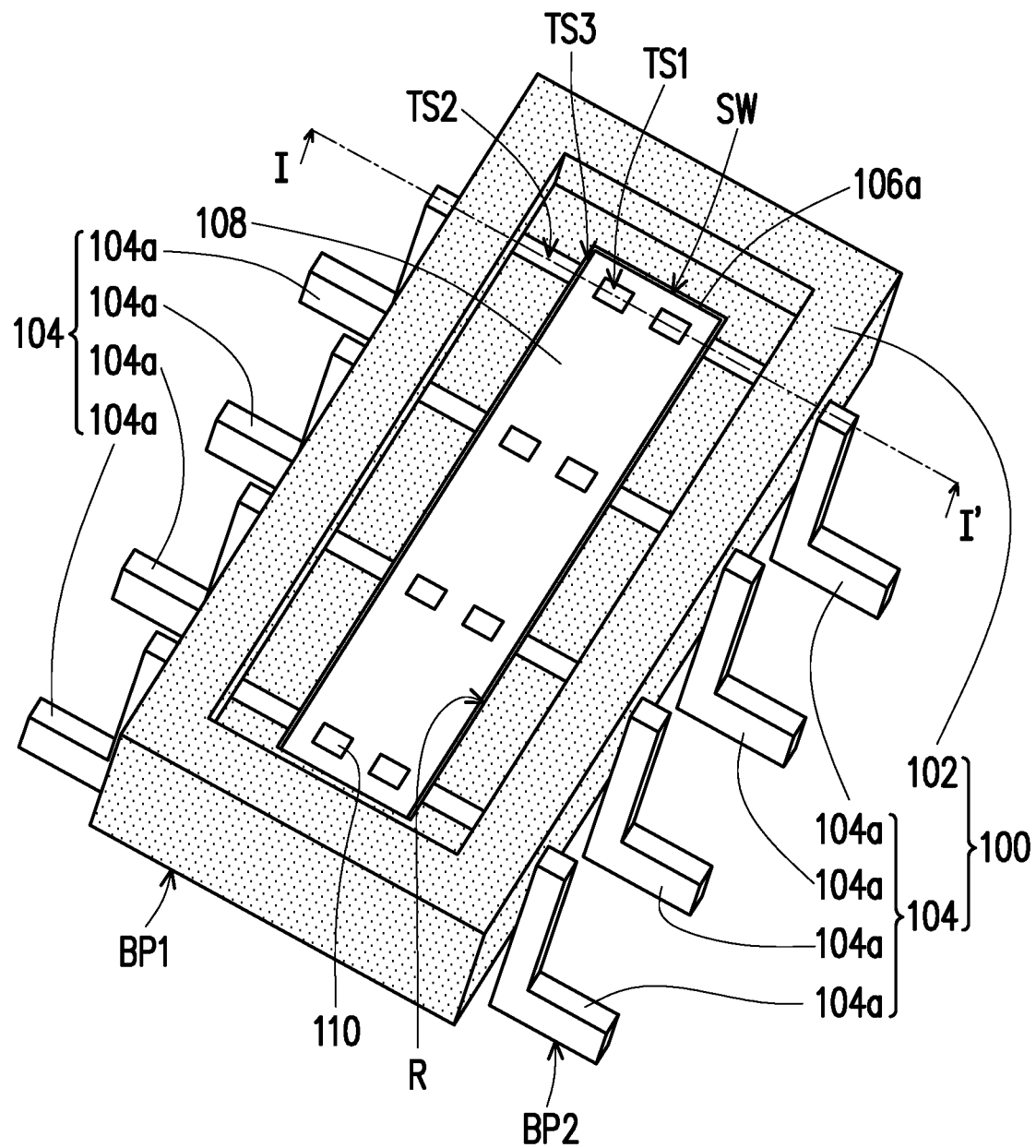
Figure 2C:
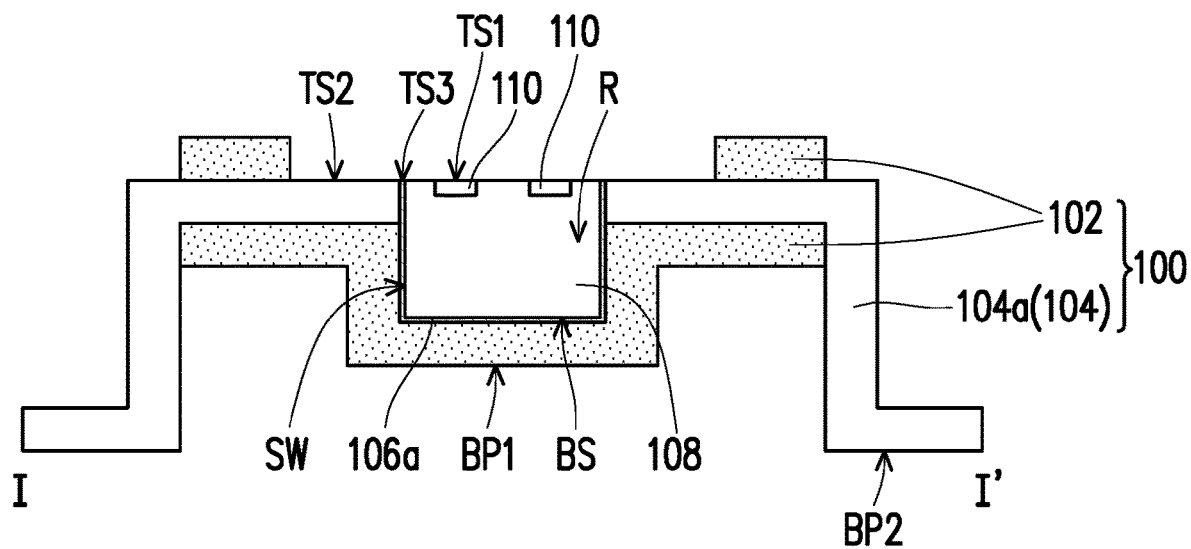

Referring to FIG. 1C and FIG. 2C, a die 108 is placed in a recess R to cause an adhesive 106 to overflow from a position between the bottom surface BS of the die 108 and the carrier 102 to a position between the sidewall SW of the die 108 and the carrier 102, thereby forming an adhesive layer 106a. In other words, a portion of the adhesive layer 106a may be located on the sidewall SW of the die 108. The die 108 may be an integrated circuit (IC) device. The die 108 includes at least one pad 110. In the present embodiment, the number of the pads 110 is, for example, plural, but as long as the number of the pads 110 is at least one, it falls within the scope of the invention.

In the present embodiment, the height of the top surface TS1 of the die 108 may be equal to the height of the top surface TS2 of the lead frame 104, thereby facilitating subsequent formation of a conductive wire by using a three-dimensional (3D) printing process. The term "equal to" herein refers to "substantially equal to", that is, there may be a tolerable error. In other embodiments, the height of the top surface TS1 of the die 108 may be higher than the height of the top surface TS2 of the lead frame 104. In addition, the top surface TS3 of the adhesive layer 106a may be equal to or higher than the top surface TS1 of the die 108 and the top surface TS2 of the lead frame 104, thereby facilitating subsequent formation of a conductive wire by using the 3D printing process. In a case that the top surface TS3 of the adhesive layer 106a is higher than the top surface TS1 of the die 108 and the top surface TS2 of the lead frame 104, the adhesive layer 106a does not completely cover the pad 110 and the lead frame 104, to prevent the adhesive layer 106a from hindering an electrical connection between the lead frame 104 and the pad 110 in the subsequent 3D printing process.

Furthermore, the recess R and the die 108 may have a same top-view shape. In the present embodiment, the top-view shapes of the recess R and the die 108 are, for example, rectangles, but the invention is not limited thereto. The top-view area of the recess R may be greater than the top-view area of the die 108 to facilitate placement of the die 108 in the recess R. The top-view area of the recess R may be proportionally 1.05 to 1.5 times greater than the top-view area of the die 108. In some embodiments, the top-view area of the recess R may be proportionally 1.1 times to 1.3 times greater than the top-view area of the die 108.

Figure 1D:
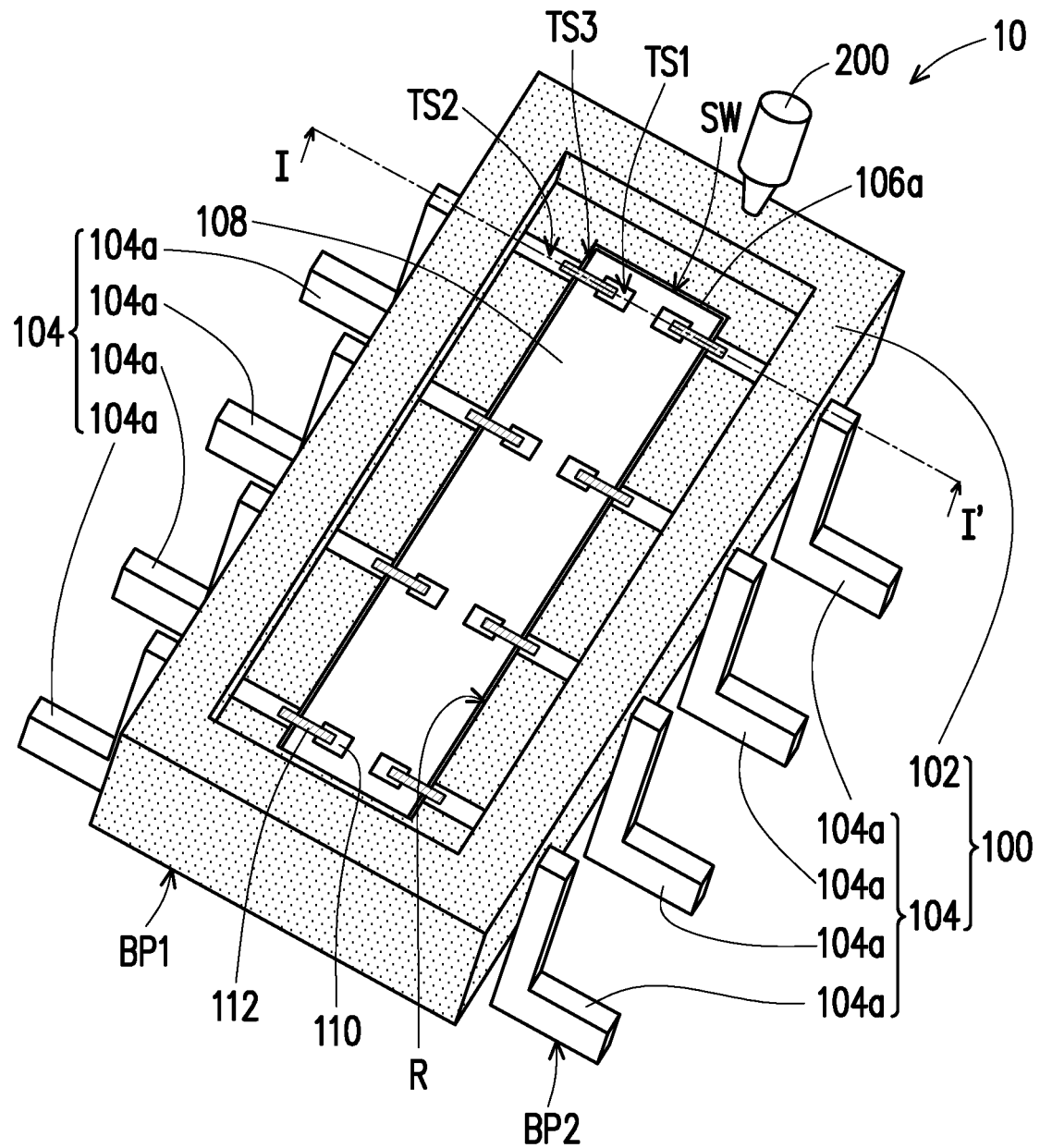
Figure 2D:
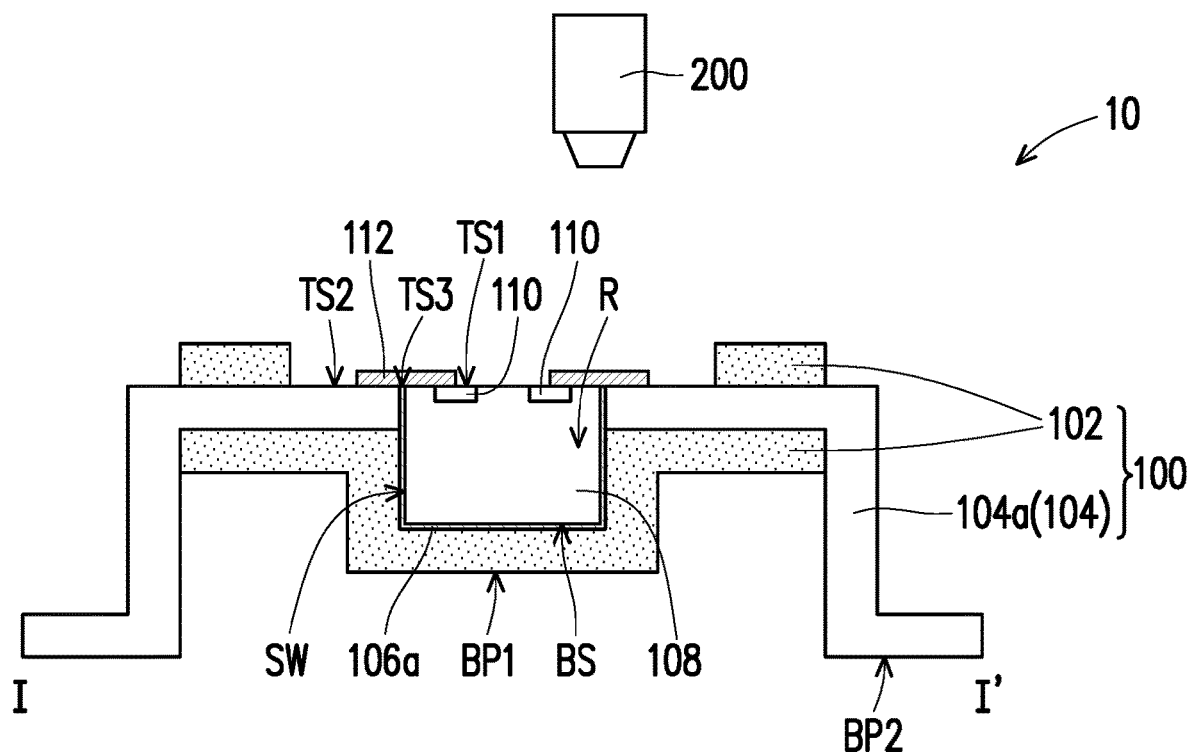

Referring to FIG. 1D and FIG. 2D, at least one 3D printing conductive wire 112 is formed on the lead frame 104, the adhesive layer 106a, and the pad 110 by using the 3D printing process. The 3D printing conductive wire 112 is electrically connected between the lead frame 104 and the pad 110. For example, a print head 200 of a 3D printer may be configured to print. The 3D printing conductive wire 112 may be directly disposed on the top surface TS2 of the lead frame 104, the top surface TS3 of the adhesive layer 106a, and the top surface TS1 of the die 108. The number of the 3D printing conductive wires 112 may be adjusted according to the number of the pads 110. The material of the 3D printing conductive wire 112 may include conductive ink, for example, metal ink such as nano silver ink or nano copper silver alloy ink.

Figure 1E:
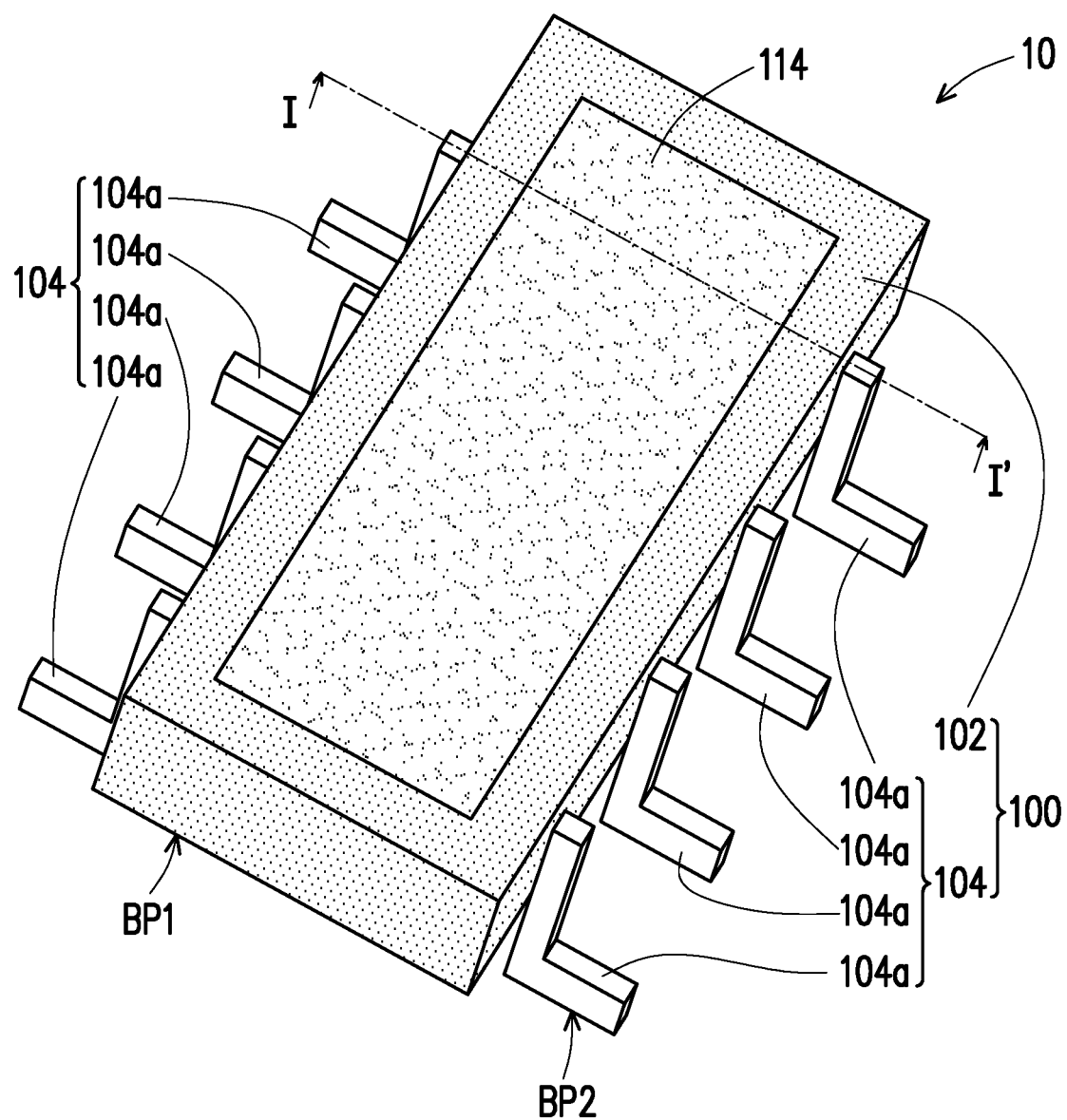
Figure 2E:
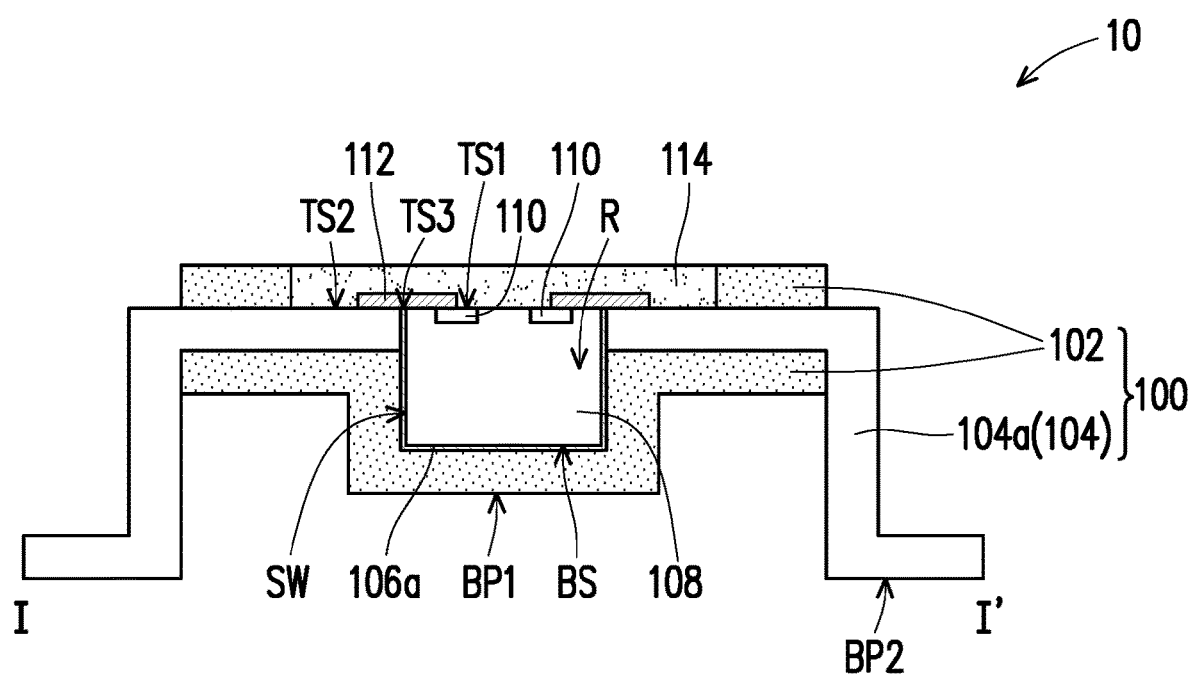

Referring to FIG. 1E and FIG. 2E, an encapsulation body 114 covering the die 108, the 3D printing conductive wire 112, and a portion of the lead frame structure 100 may be formed. The material of the encapsulation body 114 may be a molding compound such as an epoxy molding compound. The encapsulation body 114 may be formed through a molding process.

Hereinafter, the package structure 10 of the present embodiment is described with reference to FIG. 1D, FIG. 1E, FIG. 2D, and FIG. 2E. In addition, although the method of forming the package structure 10 is described by taking the foregoing method as an example, the invention is not limited thereto.

Referring to FIG. 1D, FIG. 1E, FIG. 2D, and FIG. 2E, the package structure 10 includes the lead frame structure 100, the die 108, the adhesive layer 106a, and at least one 3D printing conductive wire 112. In addition, the package structure 10 may further include the encapsulation body 114. The lead frame structure 100 includes the carrier 102 and the lead frame 104. The carrier 102 has a recess R. The lead frame 104 is disposed on the carrier 102. The die 108 is disposed in the recess R. The die 108 includes at least one pad 110. The adhesive layer 106a is disposed between the bottom surface BS of the die 108 and the carrier 102 and between the sidewall SW of the die 108 and the carrier 102. The 3D printing conductive wire 112 is disposed on the lead frame 104, the adhesive layer 106a, and the pad 110, and is electrically connected between the lead frame 104 and the pad 110. The encapsulation body 114 covers the die 108, the 3D printing conductive wire 112, and a portion of the lead frame structure 100. In addition, the material, the arrangement, the forming method, and the effect of each component in the package structure 10 have been described in detail in the foregoing embodiments, and the description thereof is not repeated here.

Based on the foregoing embodiments, in the package structure 10 and the manufacturing method thereof, the die 108 is disposed in the recess R, and the lead frame 104 is electrically connected to the pad 110 by using the 3D printing conductive wire 112. Therefore, there is no limitation on the arc height and distance of wire bonding, which further reduces a distance between the die 108 and the lead frame 104 and reduces the thickness of the package structure 10, thereby miniaturizing the package size. In addition, there is no limitation on the arc height and distance of wire bonding, thereby facilitating increase of the number of I/O leads. Furthermore, by using the package structure 10 and the manufacturing method thereof, processes such as a redistribution layer process and a wire bonding process can be omitted, thereby effectively simplifying the processes.

In summary, in the package structure and the manufacturing method thereof of the foregoing embodiments, the lead frame may be electrically connected to the pad by using the 3D printing conductive wire, thereby better miniaturizing the package size and effectively simplifying the manufacturing processes.

Although the invention has been described with reference to the above embodiments, it will be apparent to one of ordinary skill in the art that modifications to the described embodiments may be made without departing from the spirit of the invention. Accordingly, the scope of the invention is defined by the attached claims not by the above detailed descriptions.

What is claimed is:

1. A package structure, comprising:
   a lead frame structure comprising:
      a carrier having a recess; and
      a lead frame disposed on the carrier;
   a die disposed in the recess and comprising at least one pad;
   an adhesive layer disposed between a bottom surface of the die and the carrier and between a sidewall of the die and the carrier; and
   at least one three-dimensional (3D) printing conductive wire disposed on the lead frame, the adhesive layer, and the at least one pad, and electrically connected between the lead frame and the at least one pad.

2. The package structure according to claim 1, wherein a height of a top surface of the die is equal to or higher than a height of a top surface of the lead frame.

3. The package structure according to claim 1, wherein a top surface of the adhesive layer is equal to or higher than a top surface of the die and a top surface of the lead frame.

4. The package structure according to claim 1, wherein in a case that a top surface of the adhesive layer is higher than a top surface of the die and a top surface of the lead frame, the adhesive layer does not completely cover the at least one pad and the lead frame.

5. The package structure according to claim 1, wherein the carrier covers a portion of the lead frame to cause the carrier to be higher than the lead frame.

6. The package structure according to claim 1, wherein a bottom of the lead frame is lower than a bottom of the carrier.

7. The package structure according to claim 1, wherein the lead frame comprises a plurality of leads.

8. The package structure according to claim 1, wherein the recess and the die comprise a same top-view shape.

9. The package structure according to claim 1, wherein a top-view area of the recess is greater than a top-view area of the die.

10. The package structure according to claim 1, wherein a top-view area of the recess is proportionally 1.05 to 1.5 times greater than a top-view area of the die.

11. The package structure according to claim 10, wherein the top-view area of the recess is proportionally 1.1 to 1.3 times greater than the top-view area of the die.

12. The package structure according to claim 1, wherein a portion of the adhesive layer is located on the sidewall of the die.

13. The package structure according to claim 1, wherein the at least one 3D printing conductive wire is directly disposed on a top surface of the lead frame, a top surface of the adhesive layer, and a top surface of the die.

14. The package structure according to claim 1, wherein a material of the carrier comprises a molding compound.

15. The package structure according to claim 1, wherein a material of the lead frame comprises copper alloy or iron-nickel alloy.

16. The package structure according to claim 1, wherein a material of the at least one 3D printing conductive wire comprises conductive ink.

17. The package structure according to claim 1, further comprising:
   an encapsulation body covering the die, the at least one 3D printing conductive wire, and a portion of the lead frame structure.

18. The package structure according to claim 17, wherein a material of the encapsulation body comprises a molding compound.

19. A method of manufacturing a package structure, comprising:
   providing a lead frame structure, wherein the lead frame structure comprises:
      a carrier having a recess; and
      a lead frame disposed on the carrier;
   filling the recess with an adhesive layer;
   placing the die in the recess to cause the adhesive layer to overflow from a position between a bottom surface of the die and the carrier to a position between a sidewall of the die and the carrier, wherein the die comprises at least one pad; and
   forming at least one 3D printing conductive wire on the lead frame, the adhesive layer, and the at least one pad by using a 3D printing process, wherein the at least one 3D printing conductive wire is electrically connected between the lead frame and the at least one pad.

20. The method of manufacturing a package structure according to claim 19, further comprising:
   forming an encapsulation body covering the die, the at least one 3D printing conductive wire, and a portion of the lead frame structure.

* * * * *